United States Patent

Muka

[11] Patent Number: 6,079,927
[45] Date of Patent: Jun. 27, 2000

[54] AUTOMATED WAFER BUFFER FOR USE WITH WAFER PROCESSING EQUIPMENT

[75] Inventor: Richard S. Muka, Topsfield, Mass.

[73] Assignee: Varian Semiconductor Equipment Associates, Inc., Gloucester, Mass.

[21] Appl. No.: 09/064,375

[22] Filed: Apr. 22, 1998

[51] Int. Cl.[7] .............................. B65G 65/00; B65G 49/07
[52] U.S. Cl. ...................... 414/217; 414/267; 414/939; 414/940
[58] Field of Search ....................... 414/217, 411, 414/416, 267, 937, 939, 940; 204/298.25, 298.35; 118/719; 156/345

[56] References Cited

U.S. PATENT DOCUMENTS

| | | | |
|---|---|---|---|
| 4,964,776 | 10/1990 | Wakita et al. | 414/940 X |
| 5,064,337 | 11/1991 | Asakawa et al. | 414/639 |
| 5,181,819 | 1/1993 | Sakata et al. | 414/940 X |
| 5,363,867 | 11/1994 | Kawano et al. | 414/940 X |
| 5,387,067 | 2/1995 | Grunes | 414/217 |
| 5,462,397 | 10/1995 | Iwabuchi | 414/939 X |
| 5,464,313 | 11/1995 | Ohsawa | 414/940 X |
| 5,468,112 | 11/1995 | Ishii et al. | 414/940 X |
| 5,527,390 | 6/1996 | Ono et al. | 414/940 X |
| 5,553,396 | 9/1996 | Kato et al. | 414/939 X |
| 5,562,383 | 10/1996 | Iwai et al. | 414/937 X |
| 5,570,990 | 11/1996 | Bonora et al. | 414/940 X |
| 5,607,276 | 3/1997 | Muka et al. | 414/331 |
| 5,609,459 | 3/1997 | Muka | 414/217 |
| 5,613,821 | 3/1997 | Muka et al. | 414/217 |
| 5,651,823 | 7/1997 | Parodi et al. | 414/940 X |
| 5,664,925 | 9/1997 | Muka et al. | 414/217 |
| 5,788,447 | 8/1998 | Yonemitsu et al. | 414/940 X |
| 5,788,448 | 8/1998 | Wakamori et al. | 414/939 X |
| 5,855,726 | 1/1999 | Soraoka et al. | 414/940 X |

FOREIGN PATENT DOCUMENTS

| | | |
|---|---|---|
| 0 675 523 A2 | 10/1995 | European Pat. Off. . |
| 0 675 523 A3 | 10/1995 | European Pat. Off. . |
| WO99/02436 | 1/1999 | WIPO . |

OTHER PUBLICATIONS

"Preliminary Proposal and Quotation", Equipe Technologies, date unknown.

PRI Automation "PRI Intra Tool Buffer for Varian Ion Implant Systems Implant Systems", Sep., 1996.

*Primary Examiner*—Steven A. Bratlie
*Attorney, Agent, or Firm*—Wolf, Greenfield & Sacks, P.C.

[57] ABSTRACT

An automated wafer buffer is provided for use with a wafer processing system. The wafer buffer includes an I/O port for loading and unloading wafer containers, each holding a batch of wafers, a storage structure for storing up to a predetermined number of wafer containers and a container port for holding at least one wafer container during transfer of wafers to and between the wafer container and the processing system. A container transfer mechanism transfers the wafer containers to and between the I/O port, the storage structure and the container port. A wafer transfer mechanism transfers wafers to and between a wafer container at the container port and the processing system.

28 Claims, 8 Drawing Sheets

AUTOMATED WAFER BUFFER FOR USE WITH WAFER PROCESSING EQUIPMENT

FIELD OF THE INVENTION

This invention relates to automation of semiconductor wafer fabrication facilities and, more particularly, to an automated wafer buffer for use with wafer processing equipment. The automated wafer buffer handles and stores wafer containers and transfers wafers to and between the wafer containers and the processing system.

BACKGROUND OF THE INVENTION

Semiconductor wafer fabrication facilities typically include a number of wafer processing systems located in a clean room. The processing systems may include ion implanters, annealers, diffusion furnaces, sputter coating systems, etching systems and the like. Semiconductor wafers are transferred from system to system for processing in accordance with a predetermined schedule. Wafers have historically been transferred in open containers such as cassettes, either manually or using various transport systems.

A number of trends are apparent in the semiconductor wafer fabrication industry. Wafers are becoming larger, up to 300 millimeters in diameter, and device geometries are becoming smaller. A finished wafer may be worth as much as $250,000. Thus, extreme care is required in the handling of wafers to avoid even the slightest damage. Furthermore, as semiconductor device geometries become progressively smaller, the allowable particulate contamination specifications become more restrictive. In particular, particulate contamination specifications have been reduced by two orders of magnitude because of the reduction in device geometries. One of the steps taken to meet the particulate contamination specifications is to store and transport wafers in enclosed wafer containers known as front opening unified pods (FOUP's). Wafer pods typically store up to 25 wafers and have a door that is opened for access to the wafers.

Another trend is toward distributed stocking of the wafers in process. Thus, a quantity of wafers is stocked at each processing system to ensure that the processing system is not idle waiting for wafers to process. In particular, processing protocols may require stocking of a one hour backlog of wafers at each processing system. At each processing system, the wafers must be unloaded from the wafer pods and transferred into the processing system. Following completion of the processing, the wafers must be unloaded from the processing system and replaced in the wafer pods for transport to the next processing system or to a storage facility.

Encompassing both the larger wafer size and the distributed wafers in process, another trend is to minimize the process tool and wafer storage footprints due to the increasing cost of semiconductor manufacturing factories. Typically, semiconductor device manufacturers prohibit footprint increases due to the larger wafer size unless a proportional wafer processing throughput occurs.

Accordingly, it is desirable to provide an automated system for handling and storing wafer pods, and for transferring wafers to and between the wafer pods and the processing system, while meeting or exceeding particulate contamination specifications.

SUMMARY OF THE INVENTION

According to a first aspect of the invention, buffer apparatus for use with a wafer processing system is provided. The buffer apparatus comprises an I/O port for loading and unloading wafer containers, a storage structure for storing up to a predetermined number of wafer containers and a container port for holding at least one wafer container during transfer of wafers to and between the wafer container and the processing system. A container transfer mechanism transfers the wafer containers to and between the I/O port, the storage structure and the container port. A wafer transfer mechanism transfers wafers to and between the wafer container at the container port and the processing system.

The wafer containers may be front opening unified pods or other wafer containers, such as cassettes. Each wafer container holds a batch of wafers.

The storage structure may comprise one or more shelves, each having space for storing one or more wafer containers. In one embodiment, the storage shelves are disposed one above the other. The storage structure may be located above the wafer transfer mechanism.

The container transfer mechanism may comprise a container gripper and a gantry for moving the gripper to and between the I/O port, the storage structure and the container port. In one embodiment, the gripper is movable in two dimensions, and the shelves of the storage structure are individually movable between a storage position and an extended position for loading and unloading of wafer containers. In another embodiment, the container transfer mechanism includes a retractable arm coupled between the gripper and the gantry. The shelves of the storage structure have fixed positions, and the retractable arm extends the gripper into the storage structure for loading and unloading of wafer containers.

The container port may include first and second transfer stations for holding wafer containers. The processing system may include first and second processing system ports for transfer of wafers to and from the processing system.

In a first embodiment, the wafer transfer mechanism comprises a first wafer transfer robot for transferring wafers to and between the first transfer station and the first processing system port and a second wafer transfer robot for transferring wafers to and between the second transfer station and the second processing system port. The wafer transfer mechanism may further comprise a wafer dock positioned between the first and second wafer transfer robots for transferring wafers to and between the first wafer transfer robot and the second wafer transfer robot, so that the wafer transfer mechanism can transfer wafers to and between the first transfer station and the second processing system port and can transfer wafers to and between the second transfer station and the first processing system port.

In a second embodiment, the wafer transfer mechanism comprises a wafer transfer robot and means for moving the wafer transfer robot between a first position for accessing wafers in a wafer container at the first transfer station and a second position for accessing wafers in a wafer container at the second transfer station. The wafer transfer robot may access the first processing system port at the first position and may access the second processing system port at the second position.

In a first example, each wafer transfer robot transfers one wafer at a time to and between the wafer container at the container port at the processing system. In another example, the wafer transfer robot transfers several wafers at a time to and between the wafer container at the container port at the processing system. The wafer transfer robot may include means for selectively transferring a first number of wafers or a second number of wafers.

The buffer apparatus may further include an enclosure surrounding the wafer transfer mechanism and means for causing a downward air flow through the enclosure. A second enclosure may surround the storage structure, the container port and the container transfer mechanism. A downward air flow is provided through the second enclosure.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
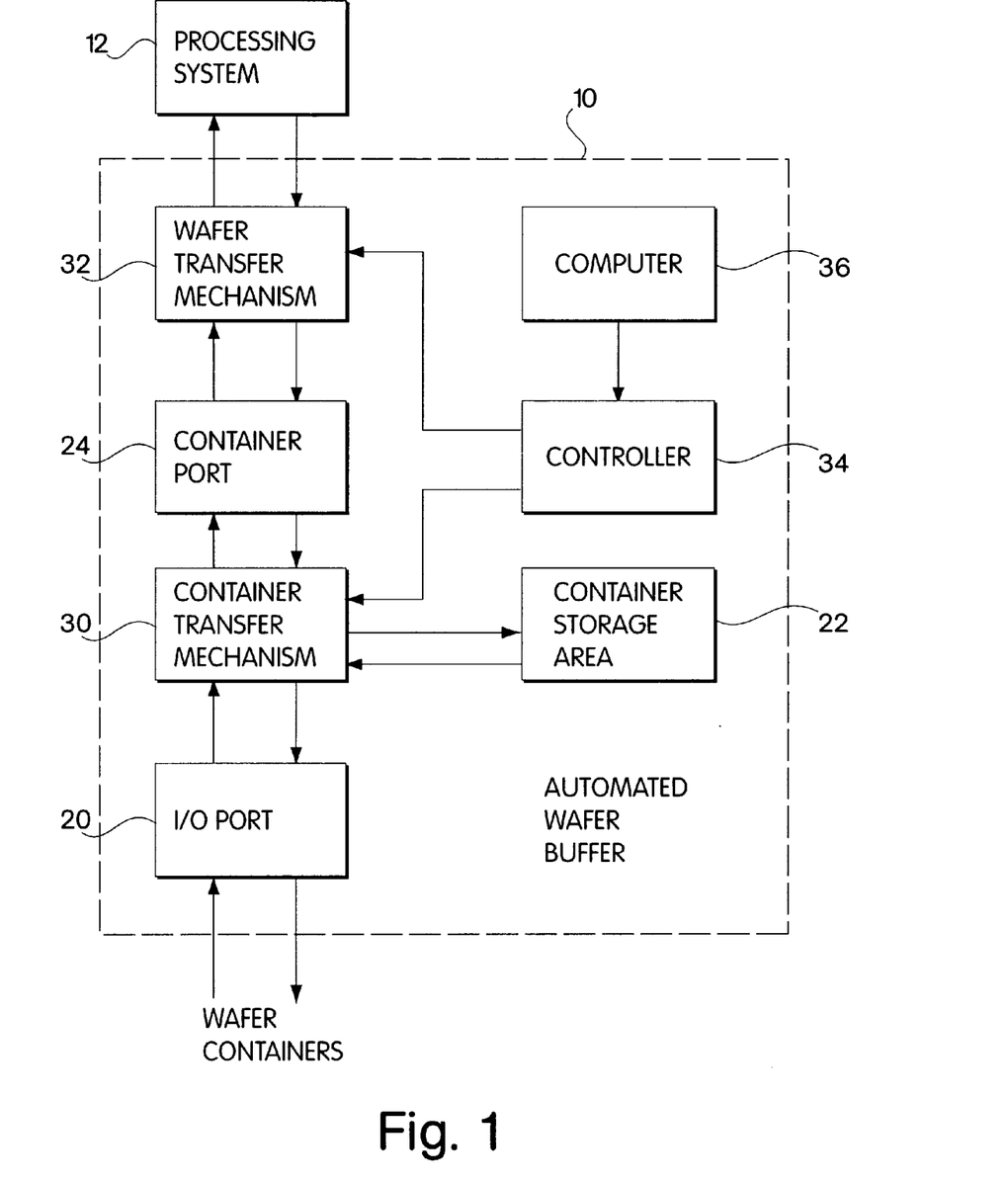
FIG. 1 is a functional block diagram of a wafer buffer in accordance with the present invention.

A functional block diagram of an example of an automated wafer buffer in accordance with the invention is shown in FIG. 1. An automated wafer buffer 10 receives wafer containers, such as wafer pods, and supplies wafers to a processing system 12 for processing. After completion of processing, automated wafer buffer 10 returns the wafers to the wafer pod and presents the pod of processed wafers for unloading.

Wafer containers are supplied to an I/O port 20 of buffer 10, either manually or by a robot or other transport system. The buffer 10 includes a container storage area 22 for storing a quantity of wafer containers. The storage area 22 may be used for storage of containers having unprocessed wafers and containers having processed wafers. A container port 24 includes one or more stations for unloading wafers from the wafer containers for transfer to processing system 12 and for loading wafers into the wafer containers after processing. A container transfer mechanism 30 moves wafer containers within buffer 10. In particular, container transfer mechanism 30 transfers wafer containers to and between I/O port 20 and storage area 22 and transfers wafer containers to and between storage area 22 and container port 24. In addition, container transfer mechanism 30 may transfer wafer containers directly to and between I/O port 20 and container port 24. A wafer transfer mechanism 32 transfers wafers, one or more at a time, to and between a wafer container at container port 24 and processing system 12. A controller 34 controls the operation of the container transfer mechanism 30 and the wafer transfer mechanism 32. A computer 36 controls and coordinates all operations of the wafer buffer.

In operation, wafer containers, each holding a batch of wafers, are loaded into the wafer buffer 10 through I/O port 20 manually or by an automated transport system. The container transfer mechanism 30 transfers the wafer containers from I/O port 20 to container storage area 22 to wait until the processing system 12 is scheduled to process the wafers. The container storage area 22 may, for example, have space for up to sixteen wafer containers. However, the capacity of the storage area is variable within the scope of the present invention and depends upon a particular application. When the wafers in a wafer container are scheduled for processing, the container transfer mechanism 30 removes the wafer container from storage area 22 and transfers it to container port 24. The wafers are unloaded from the wafer container at container port 24 by wafer transfer mechanism 32 and are loaded into the processing system. One or more wafers may be transferred at a time depending on the configuration of the processing system 12 and the wafer transfer mechanism 32. After completion of processing, wafers are unloaded from processing system 12 by wafer transfer mechanism 32 and are returned to the wafer container at container port 24. The wafer container holding processed wafers is then returned to storage area 22 by container transfer mechanism 30. When wafer containers are to be unloaded from the wafer buffer 10, the container transfer mechanism 30 transfers one or more wafer containers from storage area 22 to I/O port 20 for unloading. It will be understood that in some instances, the container transfer mechanism 30 may transfer wafer containers directly from I/O port 20 to container port 24 or from container port 24 to I/O port 20.

The operations of the wafer buffer described above may be time multiplexed for high throughput. Thus, transfers to and from I/O port 20, to and from container storage 22 and to and from container port 24 are time multiplexed by container transfer mechanism 30. Similarly, wafer transfers from container port 24 to processing system 12 and from processing system 12 to container port 24 by wafer transfer mechanism 32 may be time multiplexed. In addition, the container transfer mechanism 30 and wafer transfer mechanism 32 may operate concurrently.

As a further enhancement to throughput, the wafer buffer 10 preferably has a double buffered configuration that may be used with a processing system having two ports for loading and unloading wafers. In this configuration, the container port 24 has two transfer stations for holding wafer containers. Unprocessed wafers are unloaded from a wafer container at a first transfer station and are loaded into a first processing system port. Processed wafers are unloaded from a second processing system port and are transferred into a wafer container at the second transfer station. These operations may be simultaneous or time multiplexed, depending on the configuration of the wafer transfer mechanism 32. The double buffered configuration reduces wafer handling time and therefore increases the utilization of processing system 12.

Figure 2:
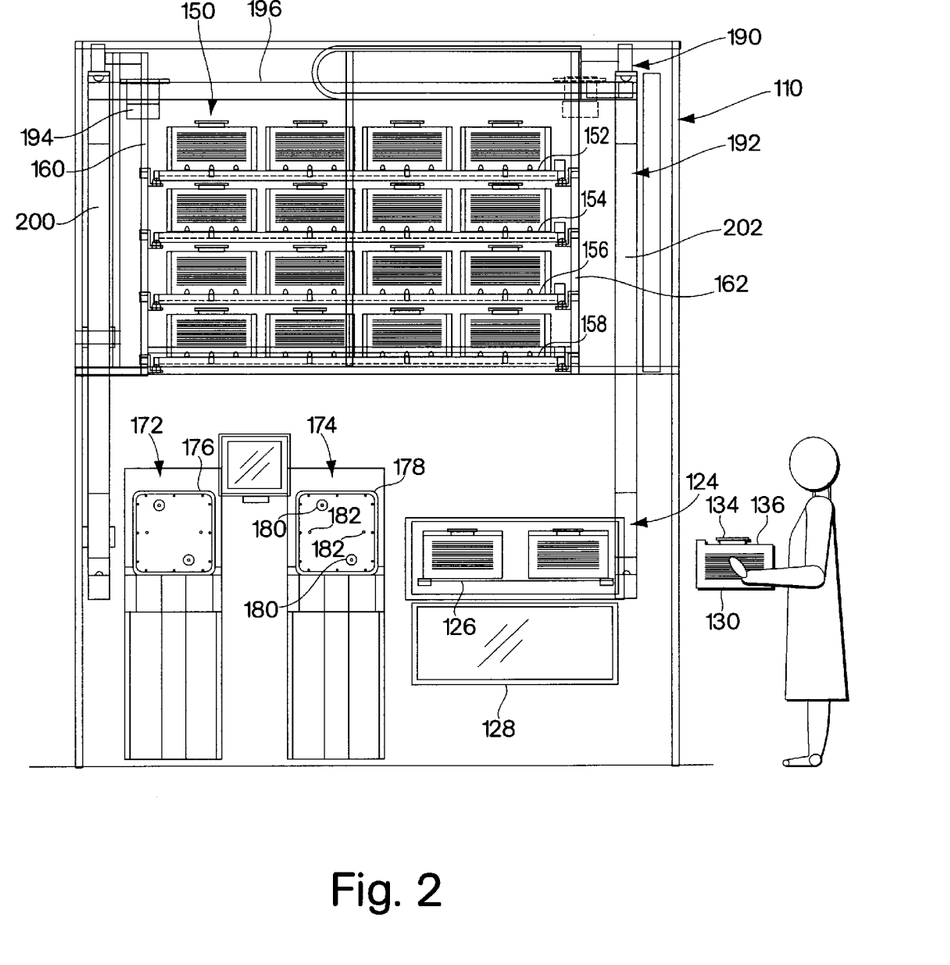
FIG. 2 is a front elevation view of an example of a wafer buffer in accordance with the invention.
Figure 3:
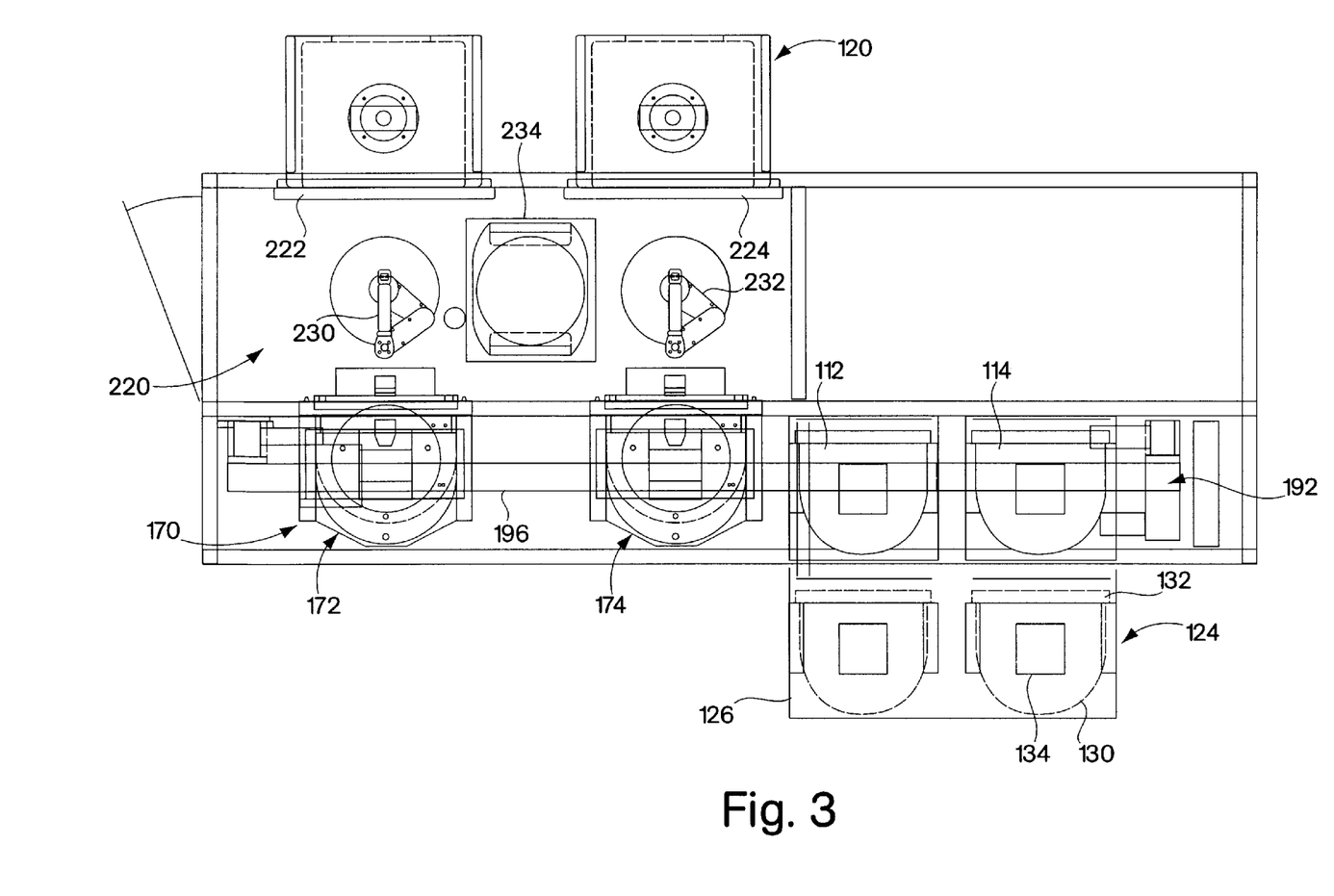
FIG. 3 is a cross-sectional top view of the wafer buffer of FIG. 2.
Figure 4:
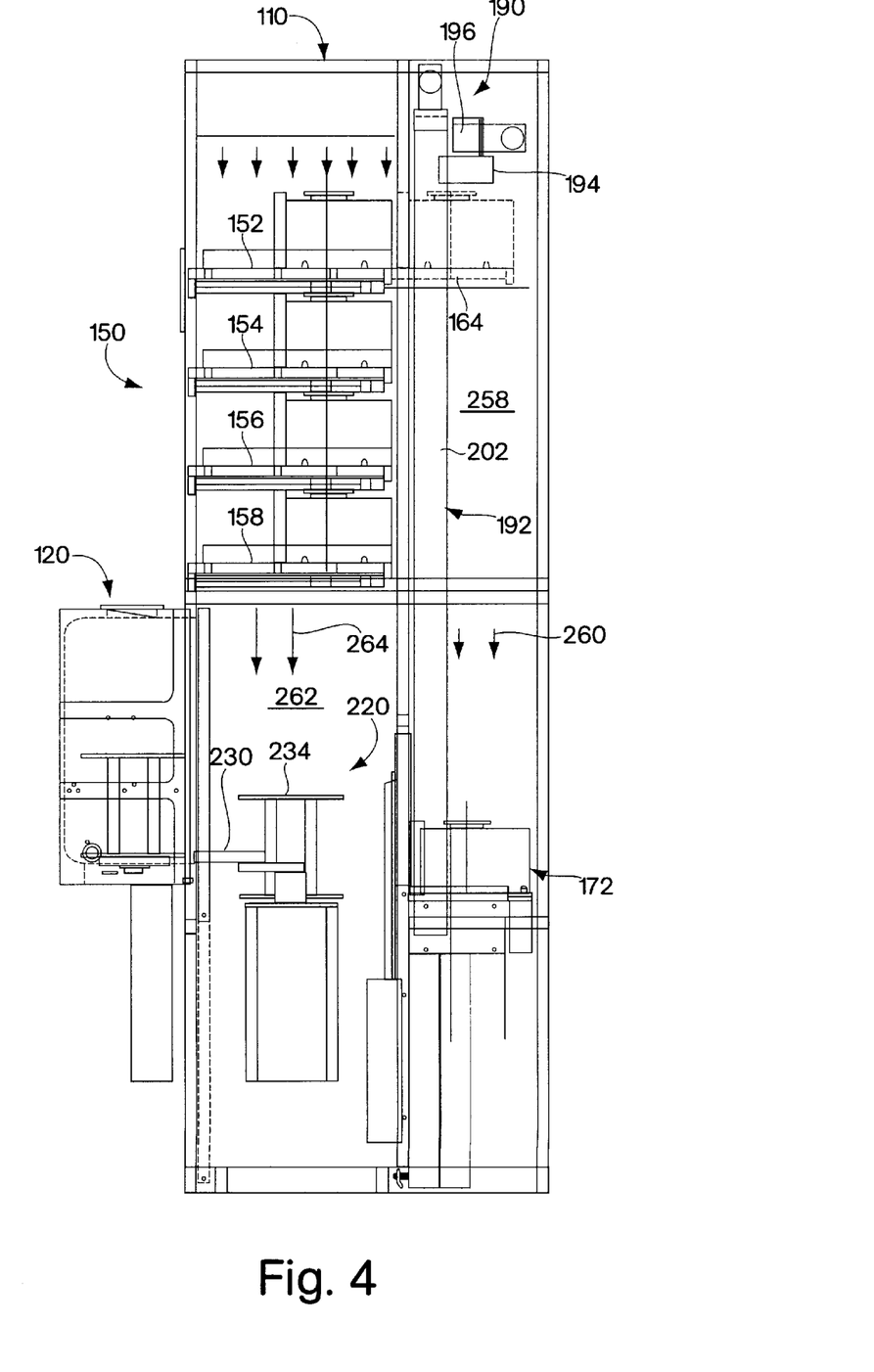
FIG. 4 is a cross-sectional side view of the wafer buffer of FIG. 2.

A first embodiment of an automated wafer buffer in accordance with the invention is shown in FIGS. 2–4. Like elements in FIGS. 2–4 have the same reference numerals. A wafer buffer 110 receives wafer containers 112 and 114, which in the embodiment of FIGS. 2–4 are wafer pods that completely enclose a batch of wafers. As shown in FIGS. 2 and 3, each of the wafer pods includes an enclosure 130 having internal slots (not shown) for holding wafers 136 in a horizontal orientation, a door 132 that covers an open side and a handle 134 which may be used for lifting and transporting the wafer pod. The wafer buffer 110 loads wafers into and unloads wafers from a processing system 120, which is partially shown in FIGS. 3 and 4. The processing system may be an ion implanter. However, it will be understood that the wafer buffer of the present invention may be utilized with other types of processing systems.

Wafer pods 112 and 114 are loaded into wafer buffer 110 through an I/O port 124. I/O port 124 includes a shelf 126 that is movable between a retracted position and an extended position, shown in phantom in FIG. 3. The shelf 126 may, for example, have spaces for receiving two wafer pods. In the extended position, shelf 126 is accessible by an operator or an automated transport system, and wafer pods may be loaded onto or removed from shelf 126. In the retracted position, shelf 126 is located with an enclosed pod handling region, and pods 112 and 114 may be transferred to other locations within wafer buffer 110. I/O port 124 may further include a door 128 which normally encloses the pod handling region and which is lowered to permit shelf 126 to be extended outwardly.

Wafer buffer 110 includes a storage area 150 for temporary storage of wafer pods. In the embodiment of FIGS. 2–4, storage area 150 includes shelves 152, 154,156 and 158 disposed one above the other. Each shelf has space for four wafer pods. The shelves are supported by rails 160 and 162. In the embodiment of FIGS. 2–4, each shelf is separately movable between a storage position and an extended position 164, shown in phantom in FIG. 4. In the extended position 164, wafer pods may be placed on or removed from each shelf. In an alternate configuration, the shelves in the storage area 150 have fixed positions, and the container transfer mechanism is configured to access wafer pods stored on the shelves. In the embodiment of FIGS. 2–4, storage area 150 has a capacity of sixteen wafer pods. It will be understood that the capacity of the storage area, the number of shelves and the number of pods per shelf may be varied within the scope of the present invention. The capacity of the storage area depends on a number of factors, including the speed of the processing system, the frequency of stocking and the like. The shelves 152, 154,156 and 158 are preferably activated between the storage and extended positions by pneumatic cylinders.

A container port 170 includes one or more transfer stations for unloading wafers from wafer pods and replacing wafers in wafer pods. In the embodiment of FIGS. 2–4, container port 170 includes a first transfer station 172 and a second transfer station 174. A wafer pod may be positioned at each of the transfer stations 172 and 174. Each transfer station includes guide pins or other positioning elements for accurately positioning the wafer pods. The wafer pods are positioned at transfer stations 172 and 174 with their doors facing the wafer transfer mechanism.

As best shown in FIG. 2, transfer station 172 includes a door 176 and transfer station 174 includes a door 178. The doors 176 and 178 provide access to a wafer transfer mechanism as described below. Each door includes suction cups 180 and guide pins 182 for attachment to the door 132 (FIG. 3) of a wafer pod. Doors 176 and 178 are attached to doors 132 of the respective pods and then are lowered with doors 132, so that the pods are open and the wafer transfer mechanism may access wafers in the wafer pods as described below.

A container transfer mechanism 190 transfers wafer pods to and between I/O port 124, storage area 150 and container port 170. More particularly, container transfer mechanism 190 may transfer wafer pods one at a time in either direction between I/O port 124 and storage area 150, may transfer wafer pods in either direction between storage area 150 and container port 170 and may transfer wafer pods in either direction between I/O port 124 and container port 170. The container transfer mechanism 190 includes a gantry 192 and a movable gripper 194 mounted on the gantry. The gripper 194 grips handle 134 at the top of the wafer pod and holds the wafer pod during transfer between locations in the wafer buffer. The gantry 192 includes a horizontal rail 196 that is supported by vertical rails 200 and 202. Gripper 194 is horizontally movable along horizontal rail 196. The horizontal rail 196 is vertically movable along vertical rails 200 and 202. Thus, by movement of gripper 194 with respect to horizontal rail 196 and movement of horizontal rail 196 with respect to vertical rails 200 and 202, gripper 194 is movable in two dimensions. By moving in two dimensions, gripper 194 can access wafer pods at I/O port 124 with shelf 126 in the retracted position, can access wafer pods in storage area 150 with one of the shelves 152, 154, 156 and 158 in the extended position and can access container port 170. An example of a suitable gripper is described below in connection with FIG. 7.

In an alternate configuration, shelves 152, 154, 156 and 158 of storage area 150 have fixed positions, and gripper 194 is connected to horizontal rail 196 by a retractable arm (not shown). The retractable arm permits gripper 194 to be moved perpendicular to a plane defined by horizontal rail 196 and vertical rails 200 and 202. In particular, gripper 194 may be extended into the storage area above shelves 152, 154, 156 and 158 for retrieving or storing a wafer pod.

The wafer buffer 110 further includes a wafer transfer mechanism 220 for transferring wafers to and between container port 170 and the processing system 120. In the embodiment of FIGS. 2–4, processing system 120 includes a first processing system port 222 and a second processing system port 224. The wafer transfer mechanism 220 unloads wafers from wafer pods located at transfer stations 172 and 174 and transfers them through ports 222 and 224 into processing system 120 for processing. After completion of processing, the wafer transfer mechanism 220 unloads wafers from the processing system and returns them to the wafer pods at transfer stations 172 and 174.

In the embodiment of FIGS. 2–4, wafer transfer mechanism 220 includes a first wafer transfer robot 230 and a second wafer transfer robot 232. Wafer transfer robot 230 is positioned between first transfer station 172 and first processing system port 222. Wafer transfer robot 232 is positioned between second transfer station 174 and second processing system port 224. Wafer transfer system 220 further includes a wafer dock 234 positioned between wafer transfer robots 230 and 232. Wafer dock 234 includes one or more slots or shelves for receiving a wafer and is accessible by either of the wafer transfer robots 230 and 232. The wafer dock 234 is used for transferring a wafer from wafer transfer robot 230 to wafer transfer robot 232, or vice versa.

The wafer dock is particularly useful where unprocessed wafers are loaded into processing system 120 through one port and the same wafers are unloaded through the other port after processing. Because it is necessary to return wafers to the same wafer pod from which they were unloaded, exchange of wafers between wafer transfer robots is required. For example, assume that a batch of wafers is transferred from a wafer pod at transfer station 172 through processing system port 222 by wafer transfer robot 230. After processing, the same batch of wafers is available for unloading at port 224. Wafer transfer robot 232 unloads the wafers through port 224 and places them in wafer dock 224. Wafer transfer robot 230 then removes the wafers from wafer dock 234 and loads them into the same wafer pod at transfer station 172. An analogous process may be performed with respect to wafers in a wafer pod at transfer station 174.

In other embodiments, the processing system may present wafers for unloading after processing at the same processing system port where they were loaded. In those embodiments, wafer dock 234 may not be necessary.

The wafer transfer robots 230 and 232 may have a variety of configurations within the scope of the invention. Depending on the type of wafer transfer robot utilized, one wafer at a time may be handled, or two or more wafers at a time may be handled. The wafer transfer robot type depends on the throughput requirements and on the configuration of the processing system 120. Where the processing system 120 includes serial load locks, which move one wafer at a time into and out of the vacuum processing chamber, single wafer transfer robots are utilized. When the processing system 120 includes batch load locks, which move batches of wafers into and out of the vacuum processing chamber, single wafer transfer robots or batch wafer transfer robots may be utilized. Furthermore, it may be necessary to accommodate wafer pods with different capacities in the wafer buffer. For example, wafer pods having capacities of 25 and 13 have been proposed. To accommodate both sizes, a single wafer lifter and a six wafer lifter may be utilized in the wafer transfer robot. Four operations of the six wafer lifter and one operation of the single wafer lifter are required in the case of wafer pods having a capacity of 25 wafers. Two operations of the six wafer lifter and one operation of the single wafer lifter are required in the case of wafer pods having a capacity of 13 wafers. Different robot configurations may be utilized to accommodate different wafer pod capacities. The wafer robot typically utilizes a horizontal blade for supporting a wafer. The blade may have vacuum channels for securing the wafer to the blade by vacuum suction during transfer. A suitable wafer transfer robot is a type ATM 505 available from Equipe Technologies of Sunnyvale, Calif.

Figure 5:
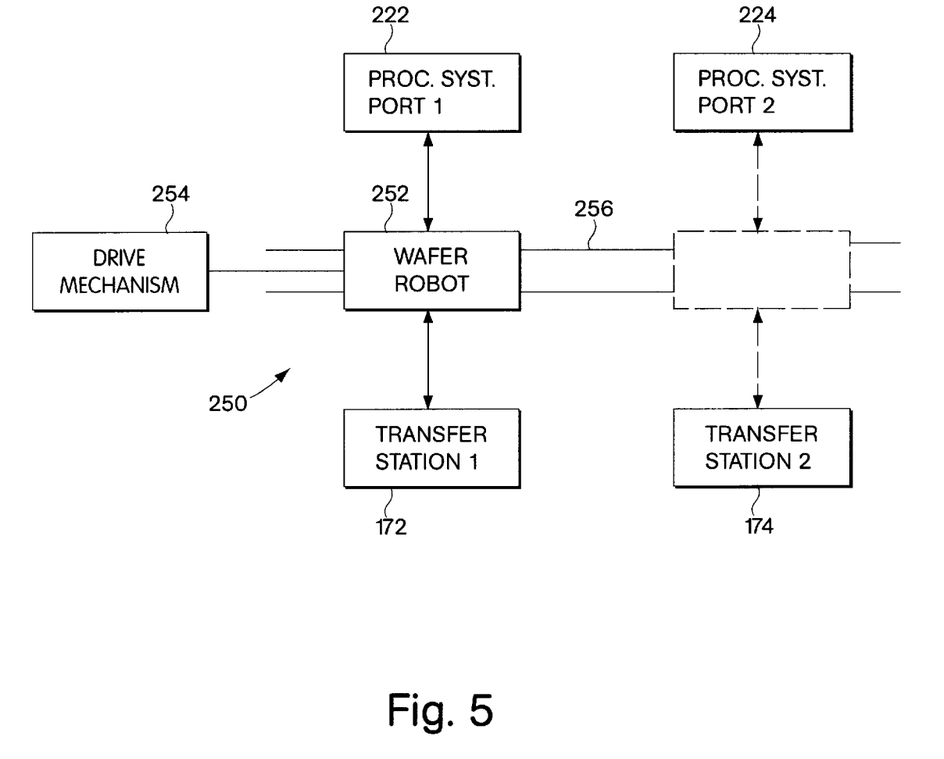
FIG. 5 is a schematic diagram that illustrates an alternate embodiment of the wafer transfer mechanism.

An alternate configuration of the wafer transfer system is shown in schematically in FIG. 5. A wafer transfer mechanism 250 includes a wafer transfer robot 252 and a drive mechanism 254. The drive mechanism 254 may move wafer transfer robot 252 between a first position between transfer station 172 and processing system port 222 and a second position (shown in phantom in FIG. 5) between transfer station 174 and processing system port 224. The wafer transfer robot 252 may move along a track 256. The configuration of FIG. 5 permits wafers to be transferred to and between transfer station 172 and processing system port 224 and to be transferred to and between transfer station 174 and processing system port 222 with a single wafer transfer robot, but without requiring a wafer dock.

In a simpler configuration, the processing system may have a single port for loading and unloading wafers. In this case, the wafer transfer mechanism may include a single fixed wafer transfer robot, and the container port may include a single transfer station.

According to a further aspect of the invention, controlled environments are provided within wafer buffer 110. As shown in FIG. 4, a first controlled environment is provided in an enclosed pod handling region 258 surrounding I/O port 124 container port 170, container transfer mechanism 190 and storage area 150. In particular, a non-turbulent airflow in a downward direction indicated by arrows 260 is provided through the region 258 where wafer pods are transported and stored. The pod handling region 258 is preferably maintained at a class 1 contamination level. A second region in which wafers are handled by wafer transfer mechanism 220 is provided with a second, separate controlled environment. A wafer handling region 262 surrounding wafer transfer mechanism 220 is provided with a non-turbulent air flow in a downward direction indicated by arrows 264. Wafer handling region 262 is isolated from pod handling region 258.

The wafer pod at container port 170 is sealed to the wall of wafer region 262, so that only the interior of the wafer pod is exposed to the wafer environment. The wafer handling region 262 is preferably maintained at a class 0.1 contamination level. The allowable contamination level in the wafer handling region 262 is lower than in the pod handling region 258, because the wafers are exposed in the wafer handling region 262. In each case, the non-turbulent air flow may be produced by a fan and such ducts and filters as may be necessary.

The mechanical configuration of the wafer buffer 110 as shown in FIGS. 2–4, is advantageous in semiconductor wafer fabrication facilities where the floor space occupied by equipment must be minimized to the extent that is practical. The wafer buffer 110 has a small front to back dimension, made possible in part by positioning storage area 150 above wafer transfer mechanism 220. Furthermore, the container transfer mechanism 190 operates in two dimensions, with the surrounding region having minimum dimensions to permit transfer of wafer pods to and between I/O port 124, storage structure 150 and container port 170.

Figure 6:
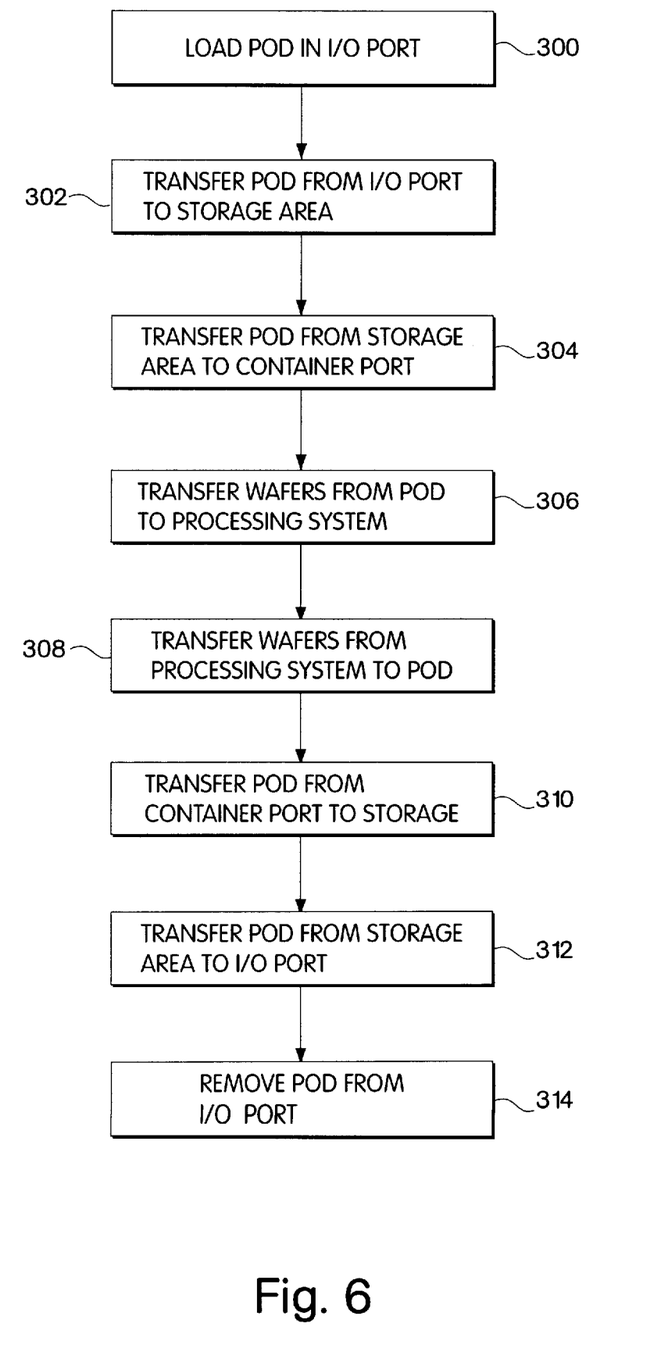
FIG. 6 is a flow diagram that illustrates the operation of the wafer buffer for a single wafer container.

Operation of the wafer buffer 110 with respect to a single wafer pod is shown in the flow chart of FIG. 6. As indicated above, multiple wafer pods may be handled in a time multiplexed manner.

In step 300, shelf 126 of I/O port 124 is moved to the extended position and a wafer pod containing wafers to be processed is placed on shelf 126 by an operator or by a robot. Shelf 126 is moved to its retracted position within wafer buffer 110, and the pod is transferred to an available space in storage area 150 in step 302. The transfer is performed by the container transfer mechanism 190. Gripper 194 lifts the pod from shelf 126 and moves it to a point adjacent to the storage area, and the appropriate shelf is extended. Gripper 194 then releases the pod onto the shelf, and the shelf is retracted to the storage position.

In step 304, the pod is transferred from the storage area 150 to the container port 170. In a similar manner, the shelf containing the desired pod is extended, and the gripper 194 lifts the pod. The shelf is then retracted to the storage position, and the container transfer mechanism 190 transfers the pod to one of the transfer stations 172 and 174.

In step 306, the wafers are transferred from the pod at the transfer station to the processing system 120. In particular, the door of the pod is opened so that the wafers may be accessed by the wafer transfer robot. Assuming that the pod is located at transfer station 172, the wafers are transferred by wafer transfer robot 230 to processing system port 222. Wafers may be transferred one at a time or in batches as described above.

After completion of processing, the wafers are removed from the processing system and replaced in the same pod in step 308. More specifically, assuming that the processed wafers are presented for unloading at the processing system port 224, the wafers are transferred by wafer transfer robot 232 from port 224 to wafer dock 234. The wafers are then transferred from wafer dock 234 to the pod at transfer station 172 by wafer transfer robot 230. After all wafers have been replaced in the pod, the door of the pod is closed.

In step 310, the pod is transferred from transfer station 172 to storage area 150 by the container transfer mechanism 190. The pod is lifted by gripper 194 and positioned adjacent to the desired location in storage area 150. The appropriate storage shelf is extended, and the gripper releases the pod onto the storage shelf. The storage shelf is then retracted.

When the wafer buffer is ready for unloading, the pod is transferred from storage area 150 to I/O port 124 in step 312.

In particular, the shelf containing the desired pod is extended and the gripper 194 lifts the pod from the shelf. The shelf is retracted to the storage position and the container transfer mechanism 190 moves the pod to shelf 126 of I/O port 124. In step 314, the pod is removed from the I/O port. The shelf 126 is moved to the extended position, and the pod is removed either manually or by a robot.

In some instances, storage of the pod may be eliminated before processing, after processing or both. In that case, the pod is transferred directly from the I/O port to the container port, or vice versa.

The operations described above are controlled and coordinated by a computer corresponding to computer 36 shown in FIG. 1. The computer controls operation of the I/O port shelf 126, container transfer mechanism 190, shelves 152, 154, 156 and 158 in storage area 150 and wafer transfer mechanism 220. Furthermore, the computer controls and coordinates multiplexed handling of multiple wafer pods.

Figure 7:
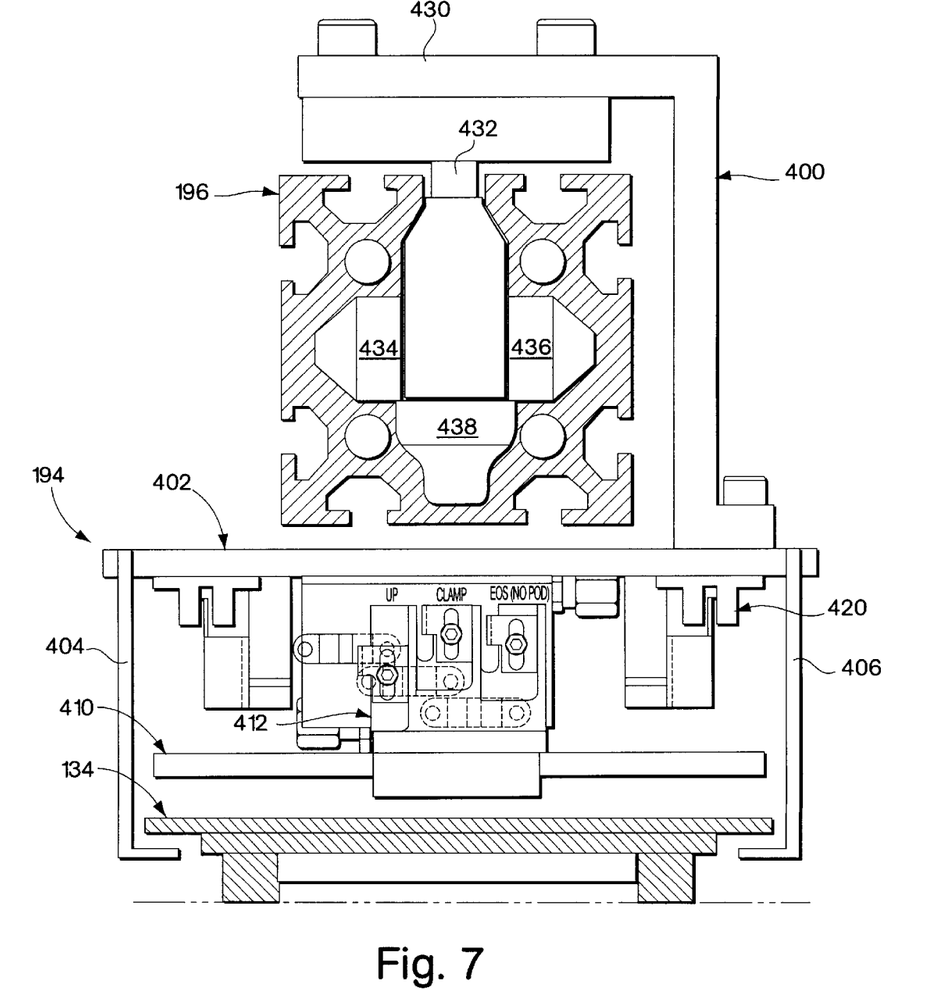
FIG. 7 is an elevation view, partly in cross section, of an example of the wafer pod gripper.

An example of a suitable gripper 194 is shown in FIG. 7. Gripper 194 is attached to rail 196 by a carriage 400. The carriage 400 and gripper 194 are movable along rail 196 in a direction perpendicular to the plane of FIG. 7. A gripper frame 402 is secured to carriage 400. Tabs 404 and 406, which may be L-shaped extend downwardly from opposite sides of frame 402. A clamp bar 410 is secured to frame 402 through a pneumatic cylinder 412. The pneumatic cylinder 412 actuates clamping bar 410 between clamped and unclamped positions. The unclamped position is shown in FIG. 7. When the clamping bar 410 is actuated to the clamping position, pod handle 134 is secured between clamping bar 410 and tabs 404 and 406. The pod may then be transferred to a desired location. The gripper 194 may include one or more optical sensors 420 for sensing obstacles in the path of gripper 194 as it is moved within the wafer buffer. Carriage 400 includes a frame 430 attached by a shaft 432 to wheels 434, 436 and 438. The wheels 434, 436 and 438 move in channels in rail 196. The carriage 400 and gripper 194 may be moved along rail 196 by a belt and pulley arrangement (not shown) or by any other suitable displacement mechanism. It will be understood that a variety of different gripper configurations may be utilized within the scope of the invention.

Figure 8:
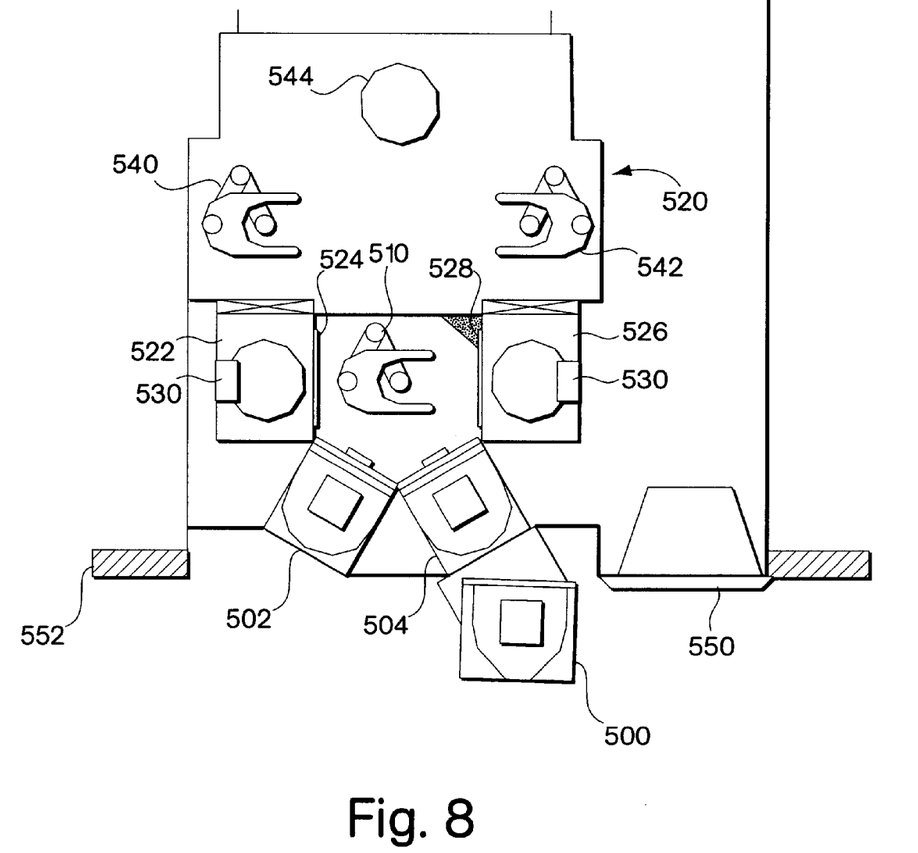
FIG. 8 is a top view of a second embodiment of a wafer buffer in accordance with the invention.

A further embodiment of a wafer buffer in accordance with the invention is shown in FIG. 8. A top schematic view is shown. The embodiment of FIG. 8 utilizes a single wafer robot. Wafer pods are introduced into the system on a loading shelf 500 that extends outwardly to a loading position. A container port includes a first transfer station 502 and a second transfer station 504. A wafer pod may be positioned at each transfer station. A wafer transfer mechanism includes a single wafer transfer robot 510. Transfer stations 502 and 504 are oriented facing robot 510. The system may include a container transfer mechanism in a container storage area as described above. A processing system 520 includes a first load lock 522 having a first processing system port 524 and a second load lock 526 having a second processing system port 528. Processing system ports 524 and 528 face wafer transfer robot 510. Each of the load locks 522 and 526 may include a wafer orienter 530. Wafer transfer robots 540 and 542 within processing system 520 transfer wafers from load locks 522 and 526, respectively, to a platen 544 for processing. In the embodiment of FIG. 8, wafer transfer robot 510 may access transfer stations 502 and 504 and processing system ports 525 and 528. The system of FIG. 8 may include an operator panel 550 and may be mounted in a clean room wall 552.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Buffer apparatus for use with a wafer processing system, comprising:
    an I/O port for loading and unloading wafer containers, each holding a plurality of wafers;
    a storage structure for storing up to a predetermined number of said wafer containers, said storage structure including one or more shelves for storage of said wafer containers, each of said shelves being movable between a storage position and an extended position for loading and unloading of said wafer containers;
    a container port for holding at least one wafer container during transfer of wafers to and between the wafer container and the processing system;
    a container transfer mechanism for transferring said wafer containers to and between said I/O port, said storage structure and said container port; and
    a wafer transfer mechanism for transferring wafers to and between the wafer container at said container port and the processing system.

2. Buffer apparatus as defined in claim 1 wherein said container transfer mechanism comprises a container gripper and a gantry for moving said gripper to and between said I/O port and said storage structure and for moving said gripper to and between said storage structure and said container port.

3. Buffer apparatus as defined in claim 2 wherein said gripper is movable in two dimensions between said I/O port, said storage structure and said container port.

4. Buffer apparatus as defined in claim 2 wherein said gantry includes a horizontal rail and wherein said gripper is coupled to said horizontal rail by a carriage that is movable along said horizontal rail.

5. Buffer apparatus as defined in claim 4 wherein said gripper comprises a gripper frame having tabs extending downwardly therefrom and a clamping bar coupled to said frame by a pneumatic cylinder, wherein said pneumatic cylinder actuates said clamping bar between an unclamped position and a clamped position wherein a wafer container is clamped between said clamp bar and said tabs.

6. Buffer apparatus as defined in claim 1 wherein said container port includes first and second transfer stations for holding said wafer containers.

7. Buffer apparatus as defined in claim 6 wherein said processing system includes first and second processing system ports for transfer of wafers to and from the processing system and wherein said wafer transfer mechanism comprises a first wafer transfer robot for transferring wafers to and between said first transfer station and the first processing system port and a second wafer transfer robot for transferring wafers to and between said second transfer station and the second processing system port.

8. Buffer apparatus as defined in claim 7 wherein said wafer transfer mechanism further comprises a wafer dock positioned between said first and second wafer transfer robots for transferring wafers to and between said first wafer transfer robot and said second wafer transfer robot, wherein said wafer transfer mechanism can transfer wafers to and between said first transfer station and said second processing system port and can transfer wafers to and between said second transfer station and said first processing system port.

9. Buffer apparatus as defined in claim 6 wherein said wafer transfer mechanism comprises a wafer transfer robot and means for moving said wafer transfer robot between a first position for accessing wafers in a wafer container at said first transfer station and a second position for accessing wafers in a wafer container at said second transfer station.

10. Buffer apparatus as defined in claim 9 wherein the processing system includes first and second processing system ports for loading and unloading wafers and wherein said wafer transfer robot accesses the first processing system port at said first position and accesses the second processing system port at said second position.

11. Buffer apparatus as defined in claim 6 wherein said processing system includes first and second processing system ports for transfer of wafers to and from the processing system and wherein said wafer transfer mechanism comprises a single wafer transfer robot for transferring wafers to and between said first and second transfer stations and said first and second processing system ports.

12. Buffer apparatus as defined in claim 11 wherein said first and second transfer stations and said first and second processing system ports face said wafer transfer robot.

13. Buffer apparatus as defined in claim 1 configured for transferring wafers to and from an ion implanter.

14. Buffer apparatus as defined in claim 1 wherein the processing system includes first and second batch load locks for loading and unloading batches of wafers.

15. Buffer apparatus as defined in claim 1 wherein said processing system includes first and second serial load locks for loading and unloading wafers serially.

16. Buffer apparatus as defined in claim 1 wherein said wafer transfer mechanism includes a wafer transfer robot for transferring one wafer at a time to and between the wafer container at said container port and the processing system.

17. Buffer apparatus as defined in claim 1 further comprising an enclosure defining a wafer handling region containing said wafer transfer mechanism and means for causing a downward air flow through said wafer handling region.

18. Buffer apparatus as defined in claim 1 further comprising an enclosure defining a container handling region surrounding said storage structure, said container port and said container transfer mechanism, and means for causing a downward air flow through said container handling region.

19. Buffer apparatus as defined in claim 1 configured for handling wafer pods that provide an enclosure for said plurality of wafers and include a door for access to said plurality of wafers.

20. Buffer apparatus as defined in claim 1 configured for handling wafer cassettes.

21. Buffer apparatus as defined in claim 1 wherein said I/O port includes means for loading and unloading two of said wafer containers at a time.

22. Buffer apparatus for use with a wafer processing system, comprising:
an I/O port for loading and unloading wafer containers, each holding a plurality of wafers;
a storage structure for storing up to a predetermined number of said wafer containers;
a container port for holding at least one wafer container during transfer of wafers to and between the wafer container and the processing system;
a container transfer mechanism for transferring said wafer containers to and between said I/O port, said storage structure and said container port; and
a wafer transfer mechanism for transferring wafers to and between the wafer container at said container port and the processing system, wherein said I/O port includes a shelf for holding one or more of said wafer containers, said shelf being movable between a retracted position within an enclosure and an extended position for loading and unloading said wafer containers, said I/O port further comprising a retractable door that is open when said shelf is in the extended position and is closed when said shelf is in the retracted position.

23. Buffer apparatus for use with a wafer processing system, comprising:
an I/O port for loading and unloading wafer containers, each holding a plurality of wafers;
a storage structure for storing up to a predetermined number of said wafer containers, said storage structure including one or more shelves for storage of said wafer containers, each of said shelves being movable between a storage position and an extended position for loading and unloading of said wafer containers;
first and second transfer stations for holding first and second wafer containers, respectively;
a container transfer mechanism for transferring said wafer containers to and between said I/O port and said storage structure and for transferring said wafer containers to and between said storage structure and said first and second transfer stations; and
a wafer transfer mechanism for transferring wafers to and between the first and second wafer containers at said first and second transfer stations, respectively, and the processing system.

24. Buffer apparatus as defined in claim 23 wherein said container transfer mechanism comprises a container gripper and a gantry for moving said gripper to and between said I/O port and said storage structure and for moving said gripper to and between said storage structure and said first and second transfer stations.

25. Buffer apparatus as defined in claim 23 wherein said processing system includes first and second processing system ports for transfer of wafers to and from the processing system and wherein said wafer transfer mechanism comprises a first wafer transfer robot for transferring wafers to and between said first transfer station and the first processing system port and a second wafer transfer robot for transferring wafers to and between said second transfer station and the second processing system port.

26. Buffer apparatus as defined in claim 25 wherein said wafer transfer mechanism further comprises a wafer dock positioned between said first and second wafer transfer robots for transferring wafers to and between said first wafer transfer robot and said second wafer transfer robot, wherein said wafer transfer mechanism can transfer wafers to and between said first transfer station and said second processing system port and can transfer wafers to and between said second transfer station and said first processing system port.

27. Buffer apparatus as defined in claim 23 wherein said wafer transfer mechanism comprises a wafer transfer robot and means for moving said wafer transfer robot between a first position for accessing wafers in a wafer container at said first transfer station and a second position for accessing wafers in a wafer container at said second transfer station.

28. Buffer apparatus as defined in claim 23 wherein said wafer transfer mechanism includes a wafer transfer robot for transferring one wafer at a time to and between the wafer container at one of said transfer stations and the processing system.

* * * * *